(12) United States Patent
Jang et al.

(10) Patent No.: US 9,448,339 B2
(45) Date of Patent: Sep. 20, 2016

(54) SUBSTRATE FOR AN ORGANIC ELECTRONIC ELEMENT AND A PRODUCTION METHOD THEREFOR

(75) Inventors: Seong Su Jang, Daejeon (KR); Yeon Keun Lee, Daejeon (KR); Kyoung Sik Moon, Daejeon (KR); Min Soo Kang, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 13/878,151

(22) PCT Filed: Oct. 7, 2011

(86) PCT No.: PCT/KR2011/007432
§ 371 (c)(1),
(2), (4) Date: Jun. 20, 2013

(87) PCT Pub. No.: WO2012/047054
PCT Pub. Date: Apr. 12, 2012

(65) Prior Publication Data
US 2013/0287936 A1 Oct. 31, 2013

(30) Foreign Application Priority Data

Oct. 7, 2010 (KR) .................. 10-2010-0097979
May 18, 2011 (KR) .................. 10-2011-0046909

(51) Int. Cl.
| | |
|---|---|
| *G02B 5/02* | (2006.01) |
| *H01L 51/52* | (2006.01) |
| *C23C 30/00* | (2006.01) |

(52) U.S. Cl.
CPC ............ *G02B 5/0221* (2013.01); *C23C 30/00* (2013.01); *H01L 51/5212* (2013.01);
(Continued)

(58) Field of Classification Search
CPC ... H01L 51/52; H01L 2251/05; H01L 33/04; H01L 33/03; H01L 33/02; C23C 30/00; G02B 5/0221; Y10T 428/24421; Y10T 428/24413; Y10T 428/24372; Y10T 428/2438; Y10T 428/24388; Y10T 428/24355; Y10T 428/24364; B05D 5/12
USPC ........................................ 428/142; 427/98.4
See application file for complete search history.

(56) References Cited

U.S. PATENT DOCUMENTS

| | | | |
|---|---|---|---|
| 2004/0177982 A1* | 9/2004 | Shibata .................... | 174/35 MS |
| 2005/0074627 A1* | 4/2005 | Ichiyanagi ............. | H01G 4/228 |
| | | | 428/689 |

(Continued)

FOREIGN PATENT DOCUMENTS

| | | |
|---|---|---|
| JP | 2005-353367 | 12/2005 |
| JP | 2005-353367 A | 12/2005 |

(Continued)

*Primary Examiner* — Nathan Van Sell
(74) *Attorney, Agent, or Firm* — Dentons US LLP

(57) ABSTRACT

The present invention relates to a substrate for an organic electronic element that enables surface resistance to be reduced and light-extraction efficiency improved, the substrate including: a base substrate; a scattering layer which is formed on the base substrate and includes an conductive pattern for reducing the surface resistance of an electrode, scattering particles for scattering light and a binder, and which forms an uneven structure in the surface opposite the base substrate; and a planarizing layer which is formed on the scattering layer and flattens the surface undulations caused by the uneven structure of the scattering layer, wherein the refractive index (Na) of the scattering particles and the refractive index (Nb) of the planarizing layer satisfy the relationship in formula 1 below. [Formula 1] |Na−Nb|≥0.3. In the formula as used herein, Na signifies the refractive index of the scattering particles and Nb signifies the refractive index of the planarizing layer.

11 Claims, 2 Drawing Sheets

(52) U.S. Cl.
CPC ...... *H01L 51/5268* (2013.01); *H01L 51/5275* (2013.01); *H01L 2251/5369* (2013.01); *Y10T 428/24364* (2015.01); *Y10T 428/24372* (2015.01); *Y10T 428/24413* (2015.01); *Y10T 428/24421* (2015.01)

(56) References Cited

U.S. PATENT DOCUMENTS

2008/0217648 A1* 9/2008 Ohara .......................... 257/103
2009/0224657 A1* 9/2009 Marks et al. ................. 313/504
2011/0001420 A1 1/2011 Tchakarov et al.

FOREIGN PATENT DOCUMENTS

| | | |
|---|---|---|
| JP | 2005353367 A | 12/2005 |
| JP | 2007-134339 A | 5/2007 |
| KR | 10-2009-0021862 | 3/2009 |
| KR | 10-2010-0047855 | 5/2010 |
| KR | 10-2010-0106412 | 10/2010 |
| WO | 2009/071822 A2 | 6/2009 |
| WO | 2009071821 A2 | 6/2009 |

* cited by examiner

SUBSTRATE FOR AN ORGANIC ELECTRONIC ELEMENT AND A PRODUCTION METHOD THEREFOR

This application is a National Stage Entry of International Application No. PCT/KR2011/007432, filed Oct. 7, 2011, and claims the benefit of Korean Application Nos. 10-2010-0097979 filed on Oct. 7, 2010, and 10-2011-0046909 filed on May 18, 2011 all of which are hereby incorporated by reference in their entirety for all purposes as if fully set forth herein.

BACKGROUND

1. Field of the Invention

The present invention relates to a substrate for an organic electronic element having a novel structure, a method for preparing the substrate, and an organic electronic device including the substrate.

2. Discussion of Related Art

An organic electronic device denotes a device capable of inducing a current of charge between electrodes and organic materials using holes and/or electrons. The organic electronic device may be, in accordance with its working mechanism, an electronic device in which excitons formed in an organic layer by photons introduced from outside light source to the device are separated into electrons and holes, and the separated electrons and holes are transported to different electrodes, thereby forming a current generator; or an electronic device in which holes and/or electrons are introduced into an organic material by applying a voltage or a current to at least two electrodes, and the device functions by the introduced electrons and holes. Types of organic electronic devices include an organic light emitting diode (OLED), an organic solar cell, an organic photo-conductor (OPC) drum and an organic transistor.

An organic light emitting diode denotes a self-emissive type device which uses an electroluminescence phenomenon of emitting light when a current is applied to a luminescent organic compound. The organic light emitting diode is garnering attention as an advanced material in various industries, such as displays and lighting, as it has advantages of superior thermal stability and low driving voltage.

SUMMARY OF THE INVENTION

The purpose of the present invention is to provide a substrate for an organic electronic element having a novel structure, a method for preparing the substrate, and the organic electronic device including the substrate.

One aspect of the present invention provides a substrate for an organic electronic element including a base substrate; a scattering layer which is formed on the base substrate and includes an conductive pattern for reducing surface resistance of an electrode, scattering particles for scattering light and a binder, and which has an uneven structure formed in a surface opposite to the base substrate; and a planarizing layer which is formed on the scattering layer and flattens surface undulations caused by the uneven structure of the scattering layer, wherein the refractive index (Na) of the scattering particles and the refractive index (Nb) of the planarizing layer satisfy the relationship in formula 1 below:

$$|Na - Nb| \geq 0.3 \quad (1)$$

wherein Na stands for the refractive index of the scattering particles and Nb stands for the refractive index of the planarizing layer.

Another aspect of the present invention provides a method for preparing the substrate, and an organic electronic device including the substrate.

EFFECT

The substrate for an organic electronic element according to the present invention can improve light extraction efficiency without a decrease of device performance, and enables uniform application of voltage over the entire device. Also, the present invention has an advantage that the preparation method is simple.

DETAILED DESCRIPTION OF EXEMPLARY EMBODIMENTS

Figure 1:
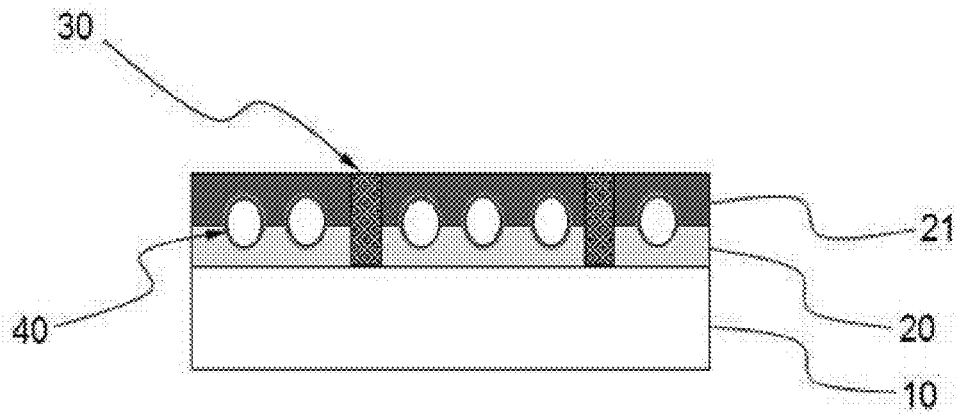
FIG. 1 illustrates a schematic diagram showing a method for preparing the substrate for an organic electronic element according to an embodiment of the present invention.

One exemplary substrate for an organic electronic element according to the present invention includes a base substrate; a scattering layer which is formed on the base substrate and includes an conductive pattern for reducing surface resistance of an electrode, scattering particles for scattering light and a binder, and which has an uneven structure formed in a surface opposite to the base substrate; and a planarizing layer which is formed on the scattering layer and flattens surface undulations caused by the uneven structure of the scattering layer, wherein the refractive index (Na) of the scattering particles and the refractive index (Nb) of the planarizing layer satisfy the relationship in formula 1 below:

$$|Na - Nb| \geq 0.3 \quad (1)$$

wherein Na stands for the refractive index of the scattering particles and Nb stands for the refractive index of the planarizing layer.

In the present invention, the electronically conductive pattern is formed in the scattering layer, and thus surface resistance of the device may be moderately or slowly increased. Indium tin oxide (ITO) is generally used as a first electrode stacked on a substrate. However, an ITO electrode generates surface resistance of about 10 $\Omega/cm^2$. The surface resistance increases as an area of the device increases, and the increased surface resistance deteriorates a uniformity of a light-emitting surface and makes difficult to increase an area of the device. The substrate for an organic electronic element according to the present invention forms an electronically conductive pattern in a scattering layer, and thus the surface resistance of the first electrode may be decreased, thereby increasing the uniformity of emission.

In one exemplary embodiment of the present invention, a surface of the conductive pattern may be exposed to a flattened surface formed by the planarizing layer. The electronically conductive pattern exposed to the flattened surface formed by the planarizing layer may be electronically connected with an electrode layer to be formed afterwards. In another exemplary embodiment of the present invention, an area ratio of the conductive pattern exposed to the flattened surface may be from 0.001% to 50%, particularly from 0.01% to 30%, more particularly 10% to 20%, relative to a total area of the flattened surface.

In a further exemplary embodiment of the present invention, a height of the conductive pattern may be from 0.01 μm to 50 μm, particularly from 0.1 μm to 10 μm, and a width of the conductive pattern may be from 0.1 μm to 500 μm, particularly from 1 μm to 100 μm.

In addition, the conductive pattern may be any kind of material as long as the material has electrical conductivity, and may be made of at least one selected from the group consisting of Ag, Au, Al, Cu, Cr, and Mo/Al/Mo. More particularly, the conductive pattern may be a network structure of a silver (Ag) paste, a metal paste including silver or a conductive material including carbon. A form of the metallic conductive pattern is not particularly limited, and may be, for example, a form in which plural metallic conductive lines are in parallel, a diagonal form, a mesh form, a honeycomb form or an amorphous form.

In an organic electronic element, for instance, in an organic light emitting diode, a total reflection occurs in the interfaces of each layer constituting the element. In particular, a first total reflection of the light generated from the organic layer occurs in the interface between a transparent electrode of which a refractive index is at least 1.8 and a glass substrate of which a refractive index is at least 1.5. Also, a second total reflection of the light passing through the glass substrate occurs in the interface between the glass substrate of which a refractive index is 1.8 and air of which a refractive index is 1.0. Due to the total reflections inside the device, the emission efficiency may be deteriorated and the brightness may be decreased.

In the present invention, the scattering particles which scatter light are located between the formed conductive patterns, which may lead to an increase in the inner light extraction efficiency. In particular, a scattering effect over the light directed from the planarizing layer to the scattering layer may be increased by making a large difference in the refractive indexes of the scattering particles and the planarizing layer, thereby minimizing the loss of reflection inside the device. According to a specific exemplary embodiment of the present invention, the refractive index of the scattering particles (Na) may be from 1.0 to 2.0, and the refractive index of the planarizing layer (Nb) may be from 1.7 to 2.5, more particularly, the refractive index of the scattering particles (Na) may be from 1.2 to 1.8, and the refractive index of the planarizing layer (Nb) may be from 1.8 to 2.0. According to a different specific exemplary embodiment of the present invention, the refractive index of the scattering particles (Na) may be from 2.0 to 3.5, and the refractive index of the planarizing layer (Nb) may be from 1.7 to 2.5, more particularly, the refractive index of the scattering particles (Na) may be from 2.2 to 3.0, and the refractive index of the planarizing layer (Nb) may be from 1.8 to 2.0.

In the present invention, the term "refractive index" denotes a refractive index measured for a light having a wavelength of from 400 nm to 450 nm under vacuum conditions.

The base substrate as used herein is not particularly limited, and may be a transparent base substrate, such as translucent plastic substrate or a glass substrate.

The scattering particles as used herein are not particularly limited as long as they can scatter light using the difference of refractive index with the planarizing layer, and may be at least one selected from the group consisting of silicon, silica, glass, titanium oxide, magnesium fluoride, zirconium oxide, alumina, cerium oxide, hafnium oxide, niobium pentoxide, tantalum pentoxide, indium oxide, tin oxide, indium tin oxide, zinc oxide, zinc sulfide, calcium carbonate, barium sulfate, silicon nitride, and aluminum nitride.

The scattering particles as used herein may be formed on the base substrate by the connection with the binder, and may be a single layer or multiple layers, or may form an uneven stacked structure. Preferably, the scattering particles as used herein may be in a structure of a single layer formed on the base substrate. When the scattering particles as used herein are formed as a single layer, light may be uniformly distributed, which enables uniform emission throughout an entire light-emitting surface. The scattering particles as used herein may be a sphere, an ellipsoid or an amorphous form, preferably a sphere or an ellipsoid form. An average diameter of the scattering particles may be from 0.01 μm to 20 μm, preferably from 0.1 μm to 5 μm.

The binder in the scattering layer as used herein is not particularly limited, and may be an organic and inorganic or organic-inorganic composite binder. According to a specific exemplary embodiment of the present invention, the binder may be an inorganic or organic-inorganic composite binder. The inorganic or organic-inorganic composite binder has superior thermal stability and chemical resistance compared with an organic binder and as such is advantageous in terms of device performance, especially lifespan. Also, the deterioration which may occur during the process of manufacturing a device, such as a high temperature process at equal to or more than 150° C., a photo process and an etching process, does not occur, and as such, it is advantageous for the production of various devices. Preferably, the binder as used herein may be at least one selected from the group consisting of silicon oxide, silicon nitride, silicon oxynitride, alumina, and an inorganic or organic-inorganic composite of which basis is siloxane bond. For instance, the inorganic binder based on a [Si—O] bond formed by polycondensation of siloxane, or the organic-inorganic composite in which alkyl groups are not completely removed in the siloxane bonds may be used.

The planarizing layer as used herein may include an inorganic binder or organic-inorganic composite binder. For instance, the planarizing layer may include at least one selected from the group consisting of silicon nitride, silicon oxynitride, alumina, and an inorganic or organic-inorganic composite based on a siloxane bond (Si—O).

The planarizing layer as used herein may further include a highly refractive filler. The highly refractive filler as used herein is intended to reduce the difference of refractive indexes of the planarizing layer and the organic device. The highly refractive filler as used herein is not particularly limited as long as it can increase the refractive index by being dispersed in the planarizing layer, and may be at least one selected from the group consisting of alumina, aluminum nitride, zirconium oxide, titanium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate and silicon nitride. For instance, the highly refractive filler as used herein may be titanium dioxide.

A thickness of the planarizing layer as used herein may be appropriately controlled depending on the device characteristics. In order to increase the light extraction efficiency, the average thickness of the planarizing layer may be 0.5 times or at least 2 times an average diameter of the scattering particles, and for instance, may be in the range from 0.5 times to 10 times, or 1 time to 5 times.

FIG. 1 illustrates a schematic diagram of stacked structure of the substrate for an organic electronic element according to an example of the present invention. Referring to FIG. 1, a scattering layer 20 including scattering particles 40 and an conductive pattern 30 is formed on a base substrate 10, and an uneven structure is formed in the opposite surface to the base substrate 10 in the substrate for an organic electronic element according to the present invention. The planarizing layer 21 is formed on the uneven structure of the scattering layer. The organic electronic element or so on may be further stacked on the planarizing layer 21.

The present invention also provides a method for preparing the substrate for an organic electronic element.

In an exemplary embodiment of the present invention, the method for preparing a substrate for an organic electronic element may include:

forming an conductive pattern on a base substrate;

forming a scattering layer on the base substrate on which the conductive pattern is formed by filling a coating solution including a binder and scattering particles; and forming a planarizing layer on the formed scattering layer.

The forming of the conductive pattern on the base substrate may be performed, for example, using a roller printing method on a sacrificial substrate. The material and shape of the conductive pattern are the same as explained above.

The forming of the scattering layer as used herein may be conducted by chemical vapor deposition (CVD), physical vapor deposition (PVD) or sol-gel coating. For example, the forming of the scattering layer may include applying a coating solution including an inorganic or organic-inorganic composite binder and scattering particles on a base substrate; and forming a matrix by polycondensation of the binder contained in the coating solution. The uneven structure may be formed by the scattering particles during the process of polycondensation of the binder contained in the coating solution.

In addition, the forming of the planarizing layer as used herein may be conducted by chemical vapor deposition (CVD), physical vapor deposition (PVD) or sol-gel coating. For example, the forming of the planarizing layer as used herein may include applying a coating solution including an inorganic binder and a highly refractive filler on the scattering layer; and forming a matrix by polycondensation of the binder contained in the coating solution.

In a further exemplary embodiment of the present invention, the method may further include polishing an upper surface of the formed planarizing layer after the forming of the planarizing layer. Through the polishing process, the upper surface of planarizing layer may be formed more uniformly. Also, an electrical connection between the conductive pattern to be exposed to the upper surface of the planarizing layer and a first electrode to be stacked afterwards may be facilitated. Types of the process of polishing an upper surface of the planarizing layer are not particularly limited, and it may be performed, for instance, by a chemical mechanical polishing (CMP) process.

Figure 2:
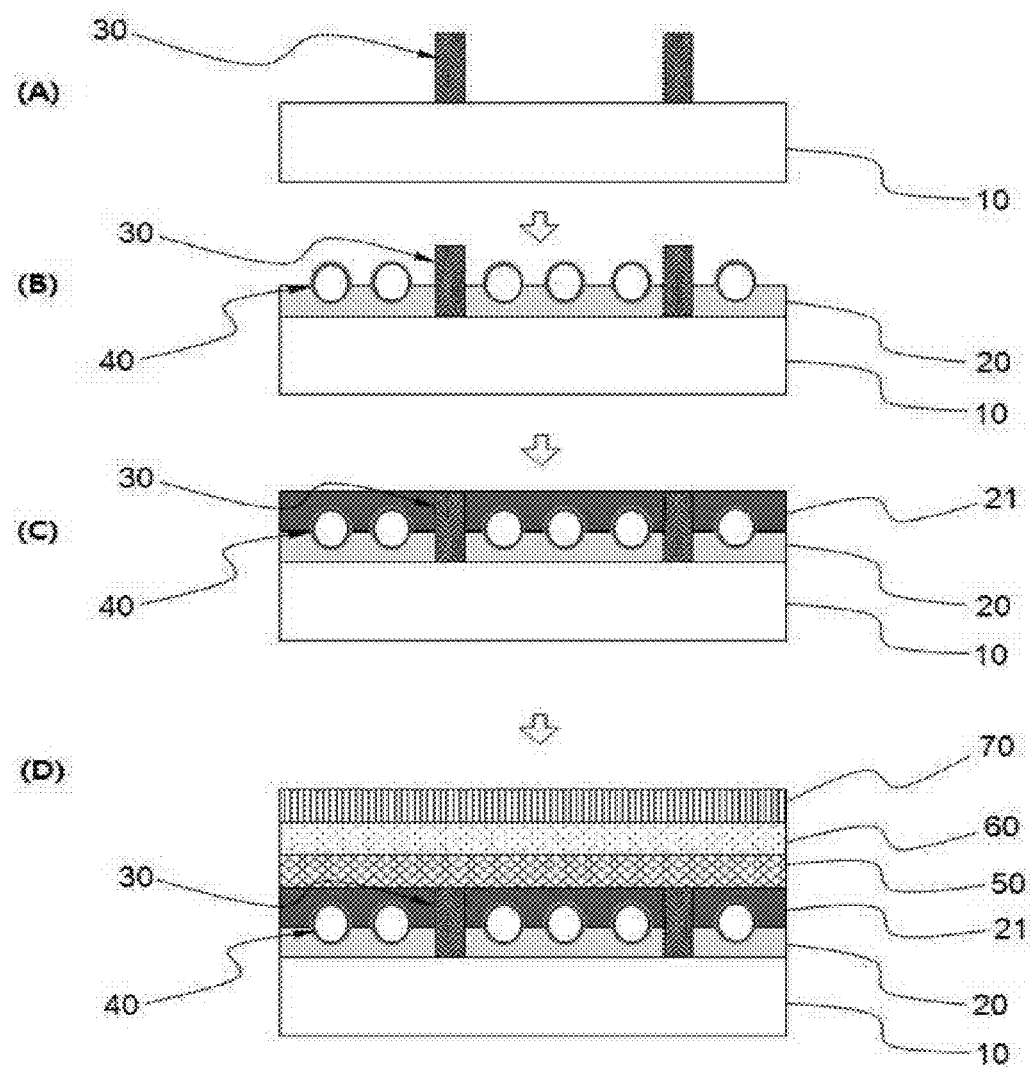
FIG. 2 illustrates a schematic diagram showing a cross section of the substrate for an organic electronic element according to an embodiment of the present invention.

FIG. 2 illustrates a schematic diagram showing a process of manufacturing the organic electronic device according to an example of the present invention. First, an conductive pattern 30 is formed on a glass substrate 10 in operation (A). The conductive pattern 30 may be formed by a roll printing method. A scattering layer may be formed by applying a coating solution in which scattering particles are dispersed in an inorganic or organic-inorganic composite binder on the base substrate and for example by sol-gel coating in operation (B). The binder component shrinks during a curing process of the formed scattering layer 20, and the uneven structure is formed by the scattering particles 40 and/or the conductive pattern 30. The planarizing layer 21 is formed on the scattering layer 20 in which the uneven structure is formed using a siloxane binder in which titanium dioxide is incorporated in operation (C). An organic electronic element may be stacked on the formed substrate for an organic electronic element in operation (D). The organic electronic element may be formed, for example, by stacking a first transparent electrode 50, an organic layer 60 including an emission layer and a second electrode 70, in this order.

Still further, the present invention provides an organic electronic device including the substrate described above and the organic electronic element formed on the substrate. Depending on the situation, a further stacked structure may be included to increase device characteristics. The structure of stacks on the substrate for an organic electronic element may be widely varied and added by those of ordinary skill in the art, and for example, the organic electronic element may be an organic light emitting diode. For instance, the organic electronic device may include a substrate for an organic electronic element; a first transparent electrode formed on the substrate; an organic layer including at least one emission layer; and a second electrode, and may further include a metal line between the first transparent electrode and the organic electronic element to compensate a voltage drop of the first transparent electrode.

Figure 3:
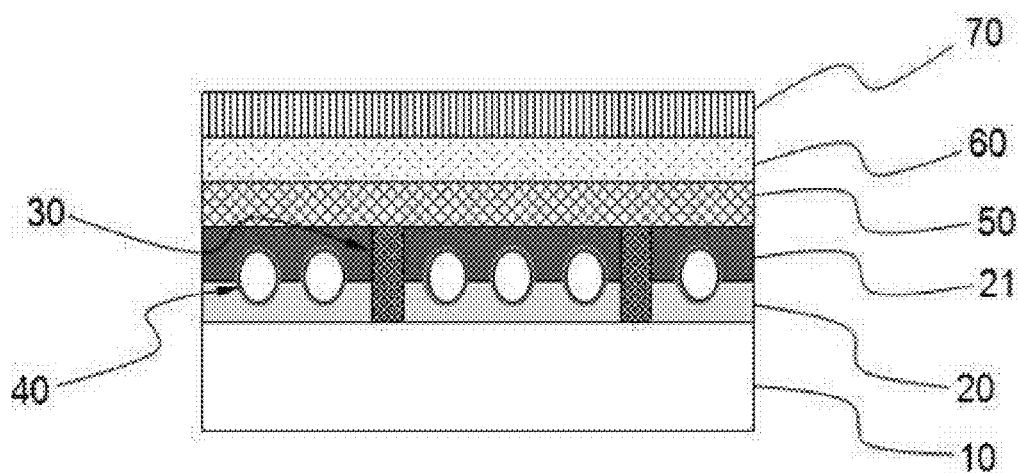
FIG. 3 illustrates a schematic diagram showing a cross section of the organic electronic device according to an embodiment of the present invention.

FIG. 3 illustrates a schematic diagram showing a stacked structure of the organic electronic element including the substrate for an organic electronic element according to an example of the present invention. Referring to FIG. 3, the organic electronic element may be constructed by forming a first electrode 50 on the substrate prepared in FIG. 1, an organic layer 60 including an emission layer, and a second electrode 70, in this order.

Hereinafter, exemplary embodiments of the present invention will be described in detail. However, the present invention is not limited to the embodiments disclosed below, but may be implemented in various forms.

EXAMPLES

Example 1

Preparation of Substrate for an Organic Electronic Element

A coating solution was prepared by sufficiently dispersing 1 g of polymer bead (XX75BQ, 3 μm in diameter, available from Sekisui) of which a refractive index was about 1.52 in TMOS 10 g ($Si(OCH_3)_4$, siloxane). An conductive pattern having a mesh form was formed by a roll printing method using a silver (Ag) paste on a glass substrate. The prepared coating solution was applied to the glass substrate on which the conductive pattern is formed. A scattering layer was formed by curing the applied coating solution. Further, the substrate for an organic electronic element in which the planarizing layer was formed was manufactured by applying and drying an inorganic binder (siloxane), in which a highly refractive filler (titanium dioxide) was dispersed, on the scattering layer. In the obtained substrate for an organic electronic element, the difference of the refractive indexes of the planarizing layer and the polymer bead was set to be 0.4 by controlling a content of the highly refractive filler during the formation of the planarizing layer.

Manufacture of OLED

A white OLED having an emission area of 2×2 $mm^2$ was manufactured by stacking a first electrode, an organic layer and a second electrode, in this order, on the highly refractive layer of the substrate for an organic electronic element prepared as described above. For the first electrode, indium tin oxide (ITO) was used, and for the second electrode, an aluminum (Al) thin layer was used. Further, the organic layer was structured to include a hole injection layer, a hole transport layer, an emission layer, an electron transport layer and an electron injection layer. For each stacked structure, the generally used materials in the field of white OLED manufacture were employed, and also, the general method was adopted for the formation thereof.

Example 2

The substrate was prepared in the same manner as Example 1, except that the amount of the scattering particles during the preparation of the coating solution was changed to 1.5 g, the difference of refractive indexes of the polymer bead and the planarizing layer was controlled to be 0.8, and an OLED element was formed on the obtained substrate.

Example 3

The substrate was prepared in the same manner as Example 1, except that TEOS ($Si(OC_2H_5)_4$) was used as the binder during the manufacture of the substrate for an organic electronic element, and an OLED element was formed on the obtained substrate.

Comparative Example 1

The substrate was prepared in the same manner as Example 1, except that methyl methacrylate was used instead of the siloxane during the manufacture of the substrate for an organic electronic element, the difference of refractive indexes of the planarizing layer and the polymer bead was controlled to be 0.2, and an OLED element was formed on the obtained substrate.

Comparative Example 2

The substrate was prepared in the same manner as Example 1, except that the difference of refractive indexes of the planarizing layer and the polymer bead was controlled to be 0.2 during the manufacture of the substrate for an organic electronic element, the conductive pattern was not formed, and an OLED element was formed on the obtained substrate.

Experimental Example 1

Comparison of Light Extraction Efficiency According to Difference of Refractive Indexes of Scattering Particles and Planarizing Layer A light extraction efficiency was comparatively measured for the OLED elements prepared in Examples 1 and 2 and Comparative Example 1. Particularly, each OLED was operated under the constant current driving condition of 0.4 mA, and the light extraction efficiency was assessed by measuring a luminous flux of the extracted light. The results are summarized in Table 1 below. In Table 1, Na denotes a refractive index of the scattering particles, Nb denotes a refractive index of the planarizing layer, and N.A. denotes a case in which the difference of the refractive indexes is substantially zero.

TABLE 1

| No. | Difference of refractive indexes (|Na-Nb|) | Luminous flux (lm) |
|---|---|---|
| Control group | N.A. | 0.052 |
| Comparative Example 1 | 0.2 | 0.068 |
| Example 1 | 0.4 | 0.075 |
| Example 2 | 0.8 | 0.080 |

Experimental Example 2

Measurement of Surface Resistance of Device

A surface resistance was measured for the organic electronic element prepared in Examples 1 and 2 and Comparative Example 1. The results are summarized in Table 2 below.

TABLE 2

| | Example 1 | Example 2 | Comparative Example 2 |
|---|---|---|---|
| Surface resistance ($\Omega/m^2$) | 5.1 | 5.2 | 38 |

From the results in Table 2, it can be seen that the surface resistance is drastically decreased in the substrate for an organic electronic element according to the present invention in which the conductive pattern is formed, compared with the conventional substrate.

INDUSTRIAL APPLICABILITY

The substrate for an organic electronic element according to the present invention can be used in various organic electronic devices, including a display device and a lighting device.

What is claimed is:

1. A substrate for an organic electronic element comprising:
    a base substrate;
    a scattering layer including a binder and scattering particles and having an uneven structure of the scattering particles configured to scatter light, and disposed on the base substrate;
    a conductive pattern disposed on the base substrate and connected to an electrode to lower a sheet resistance of the electrode; and
    a planarizing layer comprising a binder resin and formed on the scattering layer and planarizing the uneven structure of the scattering particles,
    wherein an upper portion of the conductive pattern is adjacent to the planarizing layer and wherein a top surface of an exposed conductive pattern and a top surface of the planarizing layer are in the same plane, and a ratio of an area of the exposed conductive pattern on the top surface of the planarizing layer with respect to a total area of the exposed conductive pattern and the planarizing layer is from 0.001% to 50%,
    wherein the conductive pattern comprises Mo/Al/Mo,
    wherein the binder in the scattering layer and the binder in the planarizing layer comprise an inorganic or organic-inorganic composite based on a siloxane bond,
    wherein a refractive index of the scattering particles is in a range of 2.2 to 3.0, wherein a refractive index of the planarizing layer is in a range of 1.8 to 2.0, wherein the refractive index (Na) of the scattering particles and the refractive index (Nb) of the planarizing layer satisfy the relationship in formula 1 below:

$|Na-Nb| \geq 0.3$, wherein the uneven structure of the scattering particles is disposed at an interface between the scattering layer and the planarizing layer.

2. The substrate of claim 1, wherein a height of the conductive pattern is from 0.01 µm to 50 µm, and a width of the conductive pattern is from 0.1 µm to 500 µm.

3. The substrate of claim 1, wherein the scattering particle is at least one selected from the group consisting of silicon, silica, glass, titanium oxide, magnesium fluoride, zirconium oxide, alumina, cerium oxide, hafnium oxide, niobium pentoxide, tantalum pentoxide, indium oxide, tin oxide, indium tin oxide, zinc oxide, zinc sulfide, calcium carbonate, barium sulfate, silicon nitride, and aluminum nitride.

4. The substrate of claim 1, wherein an average diameter of the scattering particles is in a range of 0.01 µm to 20 µm.

5. The substrate of claim 1, wherein the planarizing layer further comprises a high refractive filler.

6. The substrate of claim 5, wherein the high refractive filler is at least one selected from the group consisting of alumina, aluminum nitride, zirconium oxide, titanium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate and silicon nitride.

7. A method for preparing a substrate for an organic electronic element of claim 1 comprising forming a conductive pattern comprising Mo/Al/Mo on a base substrate;

forming a scattering layer by filling a coating solution comprising a binder comprising an inorganic or organic-inorganic composite based on a siloxane bond and scattering particles which have a refractive index of 2.2 to 3.0 on the base substrate, on which the conductive pattern is formed, so as to form an uneven structure of the scattering particles on a surface opposite to the base substrate; and forming a planarizing layer which has a refractive index of 1.8 to 2.0 and comprises an inorganic or organic-inorganic composite based on a siloxane bond on the uneven structure of the scattering particles of the scattering layer, so as to dispose the uneven structure of the scattering particles at an interface between the scattering layer and the planarizing layer.

8. The method of claim 7, wherein the forming of the scattering layer is conducted by CVD, PVD or sol-gel coating.

9. The method of claim 7, further comprising polishing an upper surface of the formed planarizing layer after the forming of the planarizing layer.

10. An organic electronic element comprising the substrate for an organic electronic element of claim 1.

11. An organic electronic device comprising the organic electronic element of claim 10.

* * * * *